United States Patent
Degerstrom et al.

(10) Patent No.: US 7,535,321 B1
(45) Date of Patent: May 19, 2009

(54) METHOD AND APPARATUS FOR A PRINTED CIRCUIT BOARD (PCB) EMBEDDED FILTER

(75) Inventors: Michael J. Degerstrom, Rochester, MN (US); Matthew L. Bibee, Bloomington, MN (US)

(73) Assignee: XILINX, Inc., San Jose, CA (US)

(*) Notice: Subject to any disclaimer, the term of this patent is extended or adjusted under 35 U.S.C. 154(b) by 356 days.

(21) Appl. No.: 11/333,864

(22) Filed: Jan. 17, 2006

(51) Int. Cl.
*H03H 7/01* (2006.01)

(52) U.S. Cl. .................. 333/185; 333/175; 333/22 R

(58) Field of Classification Search ............ 333/185, 333/175, 204, 22 R
See application file for complete search history.

(56) References Cited

U.S. PATENT DOCUMENTS 6,456,172 B1 * 9/2002 Ishizaki et al. ............. 333/133

2006/0250198 A1 * 11/2006 Meltzer et al. .............. 333/185

* cited by examiner

*Primary Examiner*—Benny Lee
(74) *Attorney, Agent, or Firm*—Michael T. Wallace; Michael R. Hardaway

(57) ABSTRACT

A printed circuit board (PCB) embedded filter is utilized to provide a low-pass filter characteristic using minimal lumped circuit elements. Microstrips extend on top layer of the PCB to conductive vias to form a first series connected inductive element, while microstrips extend from conductive vias to conductive vias to form a second series connected inductive element. Shunt capacitance is employed on a lower layer using striplines extending outwardly and symmetrically from conductive vias. An absorption circuit is implemented using microstrips on back layer of the PCB and capacitive plates on inner layers of the PCB. A surface mount resistor may be installed between pads to complete the absorption circuit.

20 Claims, 6 Drawing Sheets

METHOD AND APPARATUS FOR A PRINTED CIRCUIT BOARD (PCB) EMBEDDED FILTER

FIELD OF THE INVENTION

The present invention generally relates to printed circuit boards (PCBs), and more particularly to PCBs exhibiting filters embedded within the various layers of the printed circuit board (PCB).

BACKGROUND

Communication technology developments in the last decade have demonstrated what seems to be a migration from parallel data input/output (I/O) interface implementations to a preference for serial data I/O interfaces. Some of the motivations for preferring serial I/O over parallel I/O include reduced system costs through reduction in pin count, simplified system designs, and scalability to meet the ever increasing bandwidth requirements of today's communication needs. Serial I/O solutions will most probably be deployed in nearly every electronic product imaginable, including IC-to-IC interfacing, backplane connectivity, and box-to-box communications.

While serial interfaces generally offer higher clock rates through the use of, for example, point-to-point connection and low-voltage differential signaling, serial interfaces are nevertheless sensitive to reflections and crosstalk. Furthermore, the appetite for higher clock rates necessarily demands higher slew rates, which exacerbates these problems. As a rule of thumb, for example, the slew rate, which is also referred to as edge-rate or rise time, may generally be designed to be approximately ⅓ of the data bit's cycle time. Thus, for a 1 gigabit-per-second (Gbps) data rate, the cycle time for a single bit is one nanosecond, which according to the rule of thumb, suggests a 333 picosecond edge rate. Similarly, for a 10 Gbps data rate, a 33 picosecond edge rate is required to fall within the rule of thumb design constraint.

As the desirability and popularity of serial I/O interfaces continues to grow, so does the number of communication protocols that are created to use them. As each communication protocol is developed, however, legacy support for the older communication protocols is also required. Thus, the designer is increasingly challenged to deliver a more robust design, which may be used to accommodate not only the newer communication protocols, but also the legacy communication protocols as well.

Designing and validating these robust designs often introduces the designer to physical and electrical design complexities that have not been addressed or even understood before. Conventional design techniques become increasingly inadequate, since the architectures used to model the conventional designs are themselves becoming antiquated. Thus, efforts continue to aid the designer with the daunting task of meeting today's communications needs, while also accommodating legacy communication architectures that are still in use.

SUMMARY OF THE INVENTION

In the DETAILED DESCRIPTION:

To overcome limitations in the prior art, and to overcome other limitations that will become apparent upon reading and understanding the present specification, various embodiments of the present invention disclose a filter that is embedded within a printed circuit board (PCB). The filter may be implemented, therefore, with a minimal number of lumped elements so as to facilitate a simple and low cost filter solution.

In accordance with one embodiment of the invention, a filter comprises a printed circuit board (PCB) arranged as a plurality of stacked layers. The plurality of stacked layers including a first layer having an input port and an output port and a microstrip that is coupled between the input port and the output port. The microstrip has a first section extending from the input port to a first conductive via and a second section extending from the first conductive via to the output port. The plurality of stacked layers further includes a second layer that is coupled to the first layer by the first conductive via. The second layer includes a first stripline that is coupled to the first conductive via, the first stripline extending outwardly from the first conductive via along a plane of the second layer. The plurality of stacked layers further includes a third layer that is coupled to the first and second layers by the second conductive via, the third layer including an absorbing circuit that is coupled to the second conductive via.

In accordance with another embodiment of the invention, a transmission system comprises a transmission block that is coupled to receive a signal and is adapted to filter the signal prior to transmission. The transmission block includes a filter that is disposed on a plurality of layers of a printed circuit board (PCB). The PCB layers include a first layer having an input port and an output port and a signal path that is coupled between the input port and the output port to conduct the signal. The signal path is adapted to conduct the signal through a first section extending from the input port to a first conductive via and is further adapted to conduct the signal through a second section extending from a second conductive via to the output port. The PCB layers further include a second layer that is coupled to the first layer by the first conductive via. The second layer includes a first stripline that is coupled to the first conductive via. The first stripline extends outwardly from the first conductive via along a plane of the second layer. The PCB layers further include a third layer that is coupled to the first and second layers by the second conductive via. The third layer includes an absorbing circuit that is coupled to the second conductive via. In one aspect of the invention the absorbing circuit comprises: a tuning block coupled to the second conductive via; a capacitive block coupled to the tuning block; and a resistive element coupled to the capacitive block.

In accordance with another embodiment of the invention, a filter comprises a first inductive block that is coupled to an input terminal of the filter. The first inductive block is configured without lumped elements on a first layer of a printed circuit board (PCB). The filter further comprises a first capacitive block that is coupled to an output of the first inductive block. The first capacitive block is configured without lumped elements on a second layer of the PCB. The filter further comprises a second inductive block that is coupled to the output of the first inductive block and the capacitive block and is coupled to an output terminal of the filter. The second inductive block is configured without lumped elements on the first layer of the PCB. The filter further comprises an absorbing block that is coupled to the output terminal. The absorbing block includes a tuning block that is coupled to the output terminal, a second capacitive block that is coupled to the tuning block, the second capacitive block being implemented on third, fourth, and fifth layers of the PCB, and a lumped resistive element that is coupled to the capacitive block.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
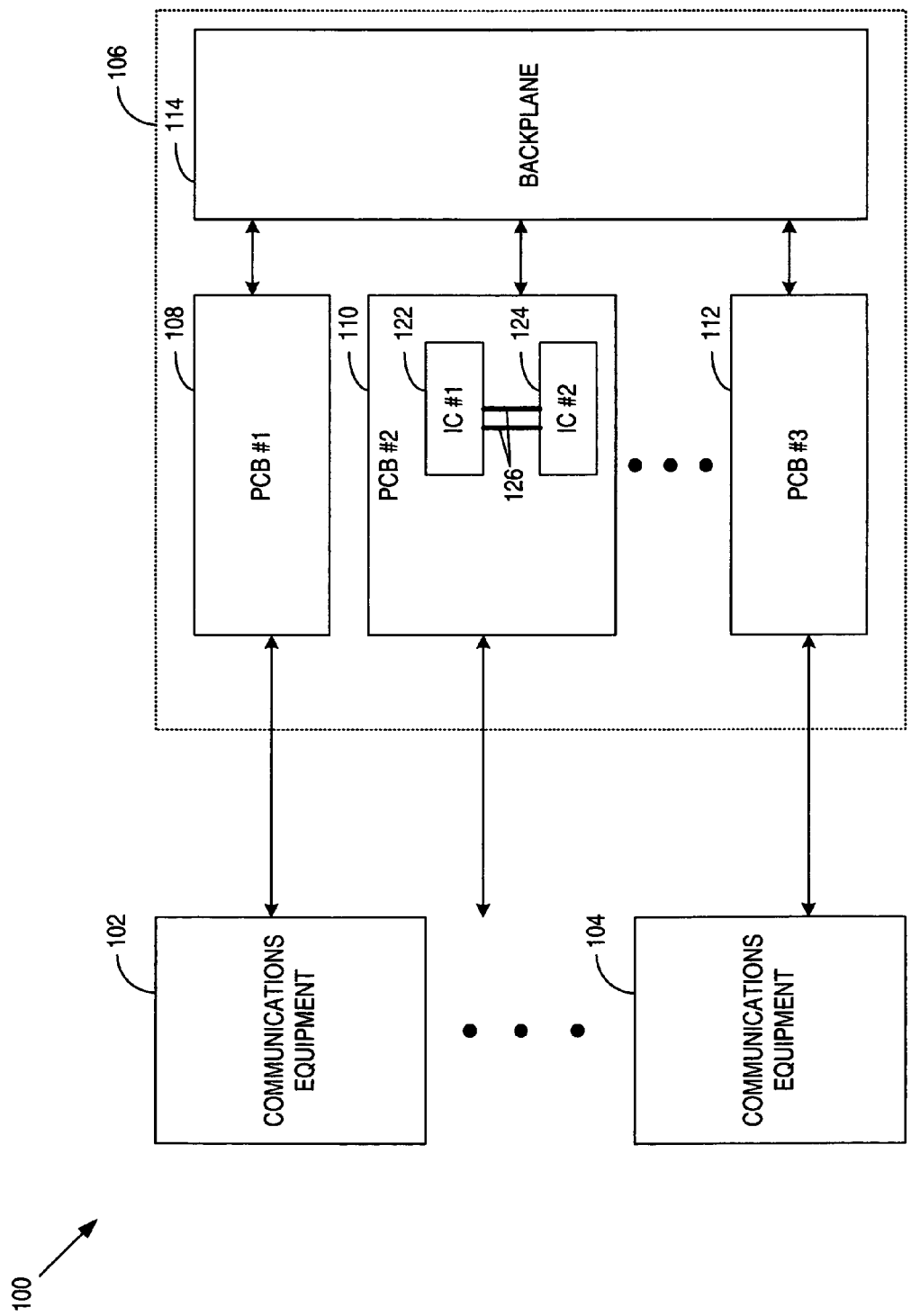
FIG. 1 illustrates an exemplary communication system.

Generally, the various embodiments of the present invention are applied to the field of printed circuit board (PCB) design. In particular, characteristics of PCB designs at each layer of the PCB are presented, which are applicable to a wide range of communication applications. All communication applications requiring the transfer of varying data rate signals are considered, for example, where signal characteristics, such as data rate and edge rate, may impact the design of signal routes within the PCB.

In particular, filter components embedded within the various layers of the PCB may be required, for example, when a serial data interface is adapted for use in both low and high data rate applications. Such may be the case, for example, when a particular transmitter is configured for use as both a high-definition serial digital interface (HD-SDI) and a standard-definition serial digital interface (SD-SDI). Both standards have similar specifications, but differ from each other at the physical layer with respect to, for example, bit rate and edge rate.

In particular, the HD-SDI specification may require, for example, that the maximum rise time, as measured between the 20% to 80% signal magnitude levels, be no more than 270 picoseconds. The SD-HDI specification, on the other hand, may require a minimum rise-time of 1100 picoseconds. In such an instance, therefore, a rise-time variation of approximately 5×(5*270=1080 picoseconds) is required in order to provide the appropriate degree of rise-time variability needed to accommodate both the HD-SDI and SD-SDI specifications from the same HD-SDI transmitter.

A PCB embedded filter may, therefore, be switched into the signal path of the HD-SDI transmitter to retard the rise time of each bit transmitted to conform to the SD-SDI standard. On the other hand, the PCB filter may be switched out of the signal path of the HD-SDI transmitter so that the maximum rise time of each bit transmitted may be unimpeded in order to conform to the HD-SDI standard.

While rise-time variation may be achieved using embedded PCB filtering, the application of embedded PCB filters is virtually unlimited and may be utilized with any communication protocol that requires specific transmitted signal characteristics to be exhibited. For example, an embedded PCB filter may be used to supply additional equalization by allowing peaking of the fundamental harmonic. These and other applications of a PCB embedded filter may be realized by communication system 100 of FIG. 1, whereby communication takes place at various levels and distances using various wired and/or wireless technologies.

Communications equipment blocks 102, . . . 104 (hereinafter 102-104), for example, may communicate with communications block 106 over a Local Area Network (LAN) or Storage Network (SN) using technologies such as 1 Gigabit Ethernet, or 10 Gigabit Ethernet, as specified by IEEE 802.3. Alternately, communication system 100 may represent a data center, a storage network, or a System Area Network (SAN), for example, in which the Infiniband serial I/O interconnect architecture, or Fiber Channel is utilized. Conversely, communication system 100 may represent a Synchronous Optical NETwork (SONET) or Synchronous Digital Hierarchy (SDH) that is employed by many Internet Service Providers (ISPs) and other high bandwidth end users.

Figure 2:
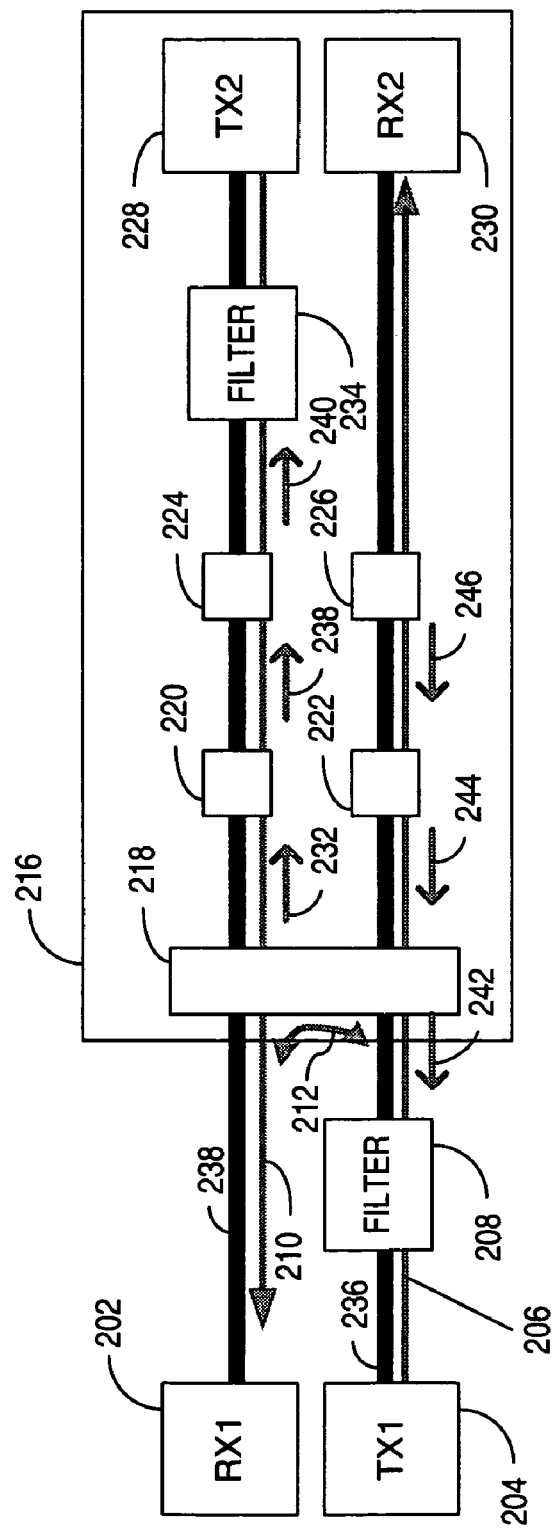
FIG. 2 illustrates a block diagram exemplifying the filtering of desired and undesired signal characteristics.

Still other communication technologies supported by communication system 100 may include Peripheral Component Interconnect (PCI), PCI-Express, RapidIO, and Serial Advanced Technology Attachment (SATA). Such communication standards may be implemented, for example, to support communications between Printed Circuit Boards (PCBs) 108, 110, . . . 112 (hereinafter 108-112), ICs 122, 124, and backplane 114. It can be seen, therefore, that communication system 100 may lend itself to many of the detrimental effects of high speed communication, some of which are illustrated in FIG. 2.

At higher data rates, for example, coupling may become an issue, whereby transmitted signal energy 206 from data path 236 may be coupled onto an adjacent data path 238 as illustrated by coupling path 212. Data paths may be routed in parallel to one another as illustrated by PCB traces 126, for example as shown in FIG. 1, which may increase the amount of signal coupling generated. One of the detrimental effects that may be caused by signal coupling is the addition/subtraction of the coupled signal's energy to/from the signal energy of the desired signal.

Specific regions of signal energy coupling may include I/O connections that are arranged as ball grid arrays (BGA), single in-line package (SIP), or dual in-line package (DIP), connections. Such connections may be facilitated, for example, using direct solder attach, or alternatively, socket mounts for ICs 122 and 124. Conversely, the connections may be facilitated via mezzanine card connections between PCBs 108-112, in the event that two or more of PCBs 108-112 are stacked. Thus, connector 218 may represent, for example, a mezzanine connection between PCB 216 and the corresponding PCB that it is stacked with. Conversely, connector 218 may represent a backplane connector between PCB 216 and, for example, backplane 114 of FIG. 1. The coupling mechanism for these cases is typically local coupling between adjacent conductive paths, or alternatively may be attributed to electromagnetic radiation, which may similarly cause additive and/or subtractive interference. Excessive electromagnetic radiation can also create electromagnetic interference (EMI) to the extent that performance falls short of compliance specifications.

Generally speaking, the combined assembly of any component, connector, and transmission medium, be it free space or transmission line, existing between the transmitter and the receiver may be defined as the channel. Thus, a communication system may be defined as a transmitter and a receiver that is separated by the channel, whereby all of the undesirable signal characteristics seen by the transmitter and the receiver may be attributed to the channel.

Other detrimental effects may be manifested through signal reflections 242, 244, and 246, which may be caused by connectors and/or components 218, 222, and 226 due to imperfect impedance matching between these connectors and components and the signal paths between them. Similarly, signal reflections 232, 238, and 240 may also result due to impedance mismatches between connectors and/or components 218, 220, and 224 and the signal paths between them.

It should be noted that signal reflections 242 and 226 should be largely absorbed by filters 208, or 234, respectively. Alternately, signal reflections 242 and 226 may instead be passed through filters 208, and 234, respectively, to be absorbed by transmitters 204, and 228, respectively. Similarly, this holds true for any undesirable backward traveling noise, whether it be other reflections or crosstalk.

In order to compensate for many of the undesirable signal characteristics of the channel, therefore, filter 208 may be incorporated into signal path 236 between transmitter/receiver pair (Tx1/Rx2) 204/230 and filter 234 may be incorporated into signal path 238 between transmitter/receiver pair (Tx2/Rx1) 228/202, respectively. In addition, filters 234 and 208 may be incorporated, or embedded, into the various layers of their respective PCB implementations.

Figure 3A:
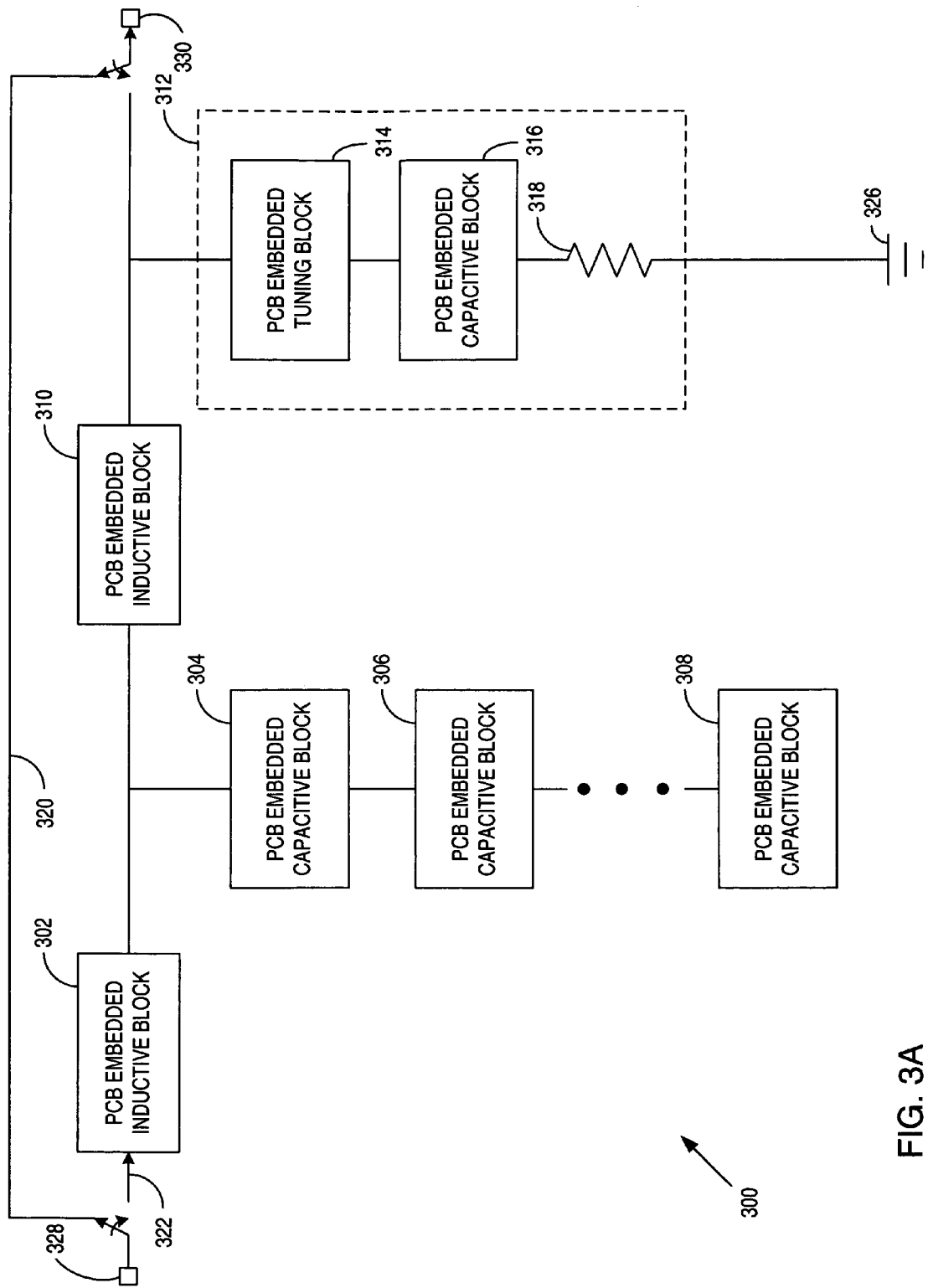
FIG. 3A illustrates an exemplary block diagram of the PCB embedded filter of FIG. 2.

Turning to FIG. 3A, block diagram 300 may represent one embodiment of PCB embedded filters 208 and 234 of FIG. 2, in which all but one component may be implemented within the various layers of multilayer PCB 216. Component 318, for example, may represent a resistive element that is not integrated within the layers of PCB 216, but may instead be implemented as a lumped resistive element. In one embodiment, component 318 may represent a surface mount (SMT) resistive component, such as a chip resistor, which mounts on either the top or the bottom layers of PCB 216 in FIG. 2.

Lumped elements may be defined as falling within one of two broad categories of components. The first category includes surface mount parts, which are suitable for use on a microwave PCB. The second category includes thin-film lumped elements, which are used on microwave integrated circuits (MICs), alumina or other hard substrates, as well as in monolithic microwave integrated circuits (MMICs). Surface mount capacitors may be useful up to Ku-band, while the inductors generally have self-resonances below X-band. Thin-film capacitors may be used up to 100 GHz in MMICs, while lumped inductors on thin-films (and MMICs) take the shape of spiral inductors, and are limited to frequencies from Ku-band and lower.

In operation, serial data may be transmitted along, for example, signal path 238 of FIG. 2 through filter 234. Alternatively, bypass path 320 may be provided so that the effects of filter 234 may not be imposed upon transmitted signal 210. Bypass path 320 may be utilized, for example, when adaptation from an SD-SDI transmission scheme to an HD-SDI transmission scheme is desired as discussed above.

Most serial data transmission applications utilize differential signaling, whereby the data signal and its complement are transmitted along a pair of transmission lines. Many advantages may be realized by differential signaling, not the least of which, is common-mode cancellation of common signal components existing on both the signal path and the complementary signal path, i.e., noise. It should be noted, therefore, that filter 300 may represent one-half of the filter requirements for a differential signal, but may represent the entire filter requirement for single-ended applications.

In order to realize a differential filter, filter 300 is mirrored through ground connection 326 to provide a filter for the corresponding complementary data path. In such an instance, ground connection 326 becomes a virtual ground connection, whereby a substantially constant potential exists at virtual ground 326, which represents the direct current (DC) component of the differential signal voltage. Moreover, resistor 318 with its mirrored resistor, may both be replaced by a single resistor having twice the resistance magnitude so as to keep the discrete component count to one.

Filter 300 exemplifies an L-C-L low-pass filter, whereby the higher frequency components of the data signal are attenuated to a greater extent than are the lower frequency components. That is to say, for example, that since the data signal represents a digital signal with abrupt transitions, or edges, between the respective logic high and logic low values, then harmonic frequency content relating to the fundamental frequency of the data signal also exists. One purpose of filter 300 is, therefore, to remove a portion of the harmonic content from the data signal, which among other effects, causes the slope of the transition between the logic levels to decrease. In other words, an increase in the amount of time that the data signal slews from one logic level to another is effected by virtue of operation of filter 300.

PCB embedded block 302 and 310 each represent series connected inductive components, whereas PCB embedded blocks 304, 306, . . . 308 (hereinafter 304-308) represent series connected capacitive components, which are coupled between inductive blocks 302 and 310 in a shunt orientation to ground planes surrounding blocks 304-308. Absorbing block 312 includes a combination of PCB embedded blocks 314 and 316 along with resistive element 318, which in one embodiment is not embedded within the PCB, but is implemented as a lumped element such as an SMT chip resistor.

Filter 300 may be tasked to propagate digital data signals operating in the gigabit frequency range. As such, a lumped element implementation of filter 300 becomes quite difficult, since each capacitive component includes an amount of inductive reactance and each inductive component includes an amount of capacitive reactance. Accordingly, the stray reactance within each lumped element operates to create a resonance, such that at some resonant frequency, the lumped elements cease behaving like capacitors and inductors and instead behave like their reactive counterparts. That is to say, for example, that lumped element capacitors may behave as inductors and lumped element inductors may behave as capacitors when operated at frequencies above their respective resonant frequencies.

Accordingly, implementation of filter 300 is established using microwave techniques, such that the control of impedance throughout filter 300 is implemented through the use of striplines, microstrips, conductive vias, and conductive planes on a plurality of vertically disposed layers of the PCB. Inductive elements, for example, may be created through the use of conductive signal traces, or striplines, on a given layer of the PCB, where in addition, the corresponding area on subsequent layers of the PCB may be void of conductive plane. Capacitive elements, on the other hand, may be implemented using conductive striplines on a given layer of the PCB, where in addition, the corresponding area on subsequent layers of the PCB may contain conductive plane.

Generally speaking, the embedded capacitive and the embedded inductive elements of filter 300 have a characteristic impedance associated with them that may be controlled through at least two dimensions. In a first dimension, the width of the striplines may be reduced to increase the characteristic impedance of the component. In a second dimension, a direct relationship between the characteristic impedance of the component and the distance from the component to its corresponding ground plane exists. Thus, the distance between the stripline and the corresponding ground plane may be increased to increase the characteristic impedance of the component.

Alternatively, the combination of widening the stripline and decreasing the distance from the stripline to its corresponding ground plane can contribute to lowering the characteristic impedance. Conversely, the combination of narrowing the stripline and increasing the distance from the stripline to its corresponding ground planes can contribute to raising the characteristic impedance. It should be understood that microstrips may be used in place of striplines, since microstrips are particularly useful in achieving high characteristic impedances. Microstrips typically exist on the outer layers of the PCB and have normally only one ground plane reference, whereas striplines are located on inner PCB layers and reference ground through upper and lower PCB planes.

Filter 300 may, therefore, be modeled as if it were a transmission line comprised of series and shunt connected components, each component having a characteristic impedance, $Z_0$, where $Z_0$ may be defined as:

$$Z_0 = \sqrt{\frac{L}{C}}. \tag{1}$$

L is the instantaneous inductance and C is the instantaneous capacitance as measured at any point along the signal path of filter 300. Generally, the characteristic impedance, $Z_0$, may be designed as a fixed impedance value, e.g., 50 ohms, or some other value as may be required by the particular application. For example, inductance may be realized using, for example, a microstrip having some length, $LENGTH_L$, that exhibits a relatively high characteristic impedance, e.g., 100 ohms, whereas capacitance may be realized, for example, using striplines having some length, $LENGTH_C$, that exhibits a lower characteristic impedance, e.g., 25 ohms.

In order to modify the characteristic impedance of an inductive or capacitive stripline or microstrip, the inductance and capacitance values of equation (1) may be modulated by a modulation variable, P, whereby inductance, L, is multiplied by P and capacitance, C, is divided by P. Thus, equation (1), which is valid for homogeneous media as is the case with striplines, but must be augmented for non-homogenous media such as with microstrips, becomes:

$$Z_0 = \sqrt{\frac{P*L}{C/P}} = \sqrt{\frac{P^2*L}{C}} = P*\sqrt{\frac{L}{C}}. \tag{2}$$

Since PCB embedded inductive blocks 302 and 310 and PCB embedded capacitive blocks 304-308 represent inductive and capacitive components of an L-C-L filter, however, the inductance and capacitance magnitudes of the PCB embedded blocks are needed in order to characterize the frequency response of filter 300. As such, relationships between characteristic impedance, $Z_0$, microstrip length, $LENGTH_L$, and stripline length, $LENGTH_C$, may be established to determine the required inductance and capacitance values.

For example equation (3) may be used to determine the length of the microstrip that is required to realize the desired inductance magnitude of embedded inductive blocks 302 and 310 in a 50 ohm system:

$$LENGTH_L = \frac{L}{DELAY_L \left[ Z_0 - \frac{50^2}{Z_0} \right]}. \tag{3}$$

Variable, $DELAY_L$, is the propagation delay per unit length through the microstrip and it is calculated as:

$$DELAY_L = \frac{\sqrt{Er}}{c}, \tag{4}$$

where c is the speed of light and Er is the effective dielectric constant of the microstrip that is taken to have a value of, for example, 3. The effective dielectric constant may be obtained by combining the dielectric constant of the dielectric used in the PCB with the dielectric constant of free space, since the microstrip implementing PCB embedded inductive blocks 302 and 310 exists on an exposed layer of the PCB. Thus, given that an inductance, L, of 6250 pico-Henries (pH) is desired for either of blocks 302 and 310, $LENGTH_L$ is calculated to be approximately 0.570 inches.

Similarly, the length of striplines required to implement PCB embedded capacitive blocks 304-308 may be calculated. Assuming that lower characteristic impedance, e.g., 25 ohm, striplines may be implemented, the capacitance per unit length of each stripline may be calculated as:

$$C_L = \frac{DELAY_L}{Z_0}, \tag{5}$$

where $DELAY_L$ is calculated as in equation (4), except that the dielectric constant of the PCB, e.g., 4.2 is used, since there is no free space dielectric component associated with striplines that exist on internal layers of the PCB.

Thus, by solving equation (5), CL for each stripline is calculated to be approximately 6.93 pF per inch. Given that a 5.0 pF capacitance, C, is required, for example, then the total length, $LENGTH_C$, of the stripline may be calculated as:

$$LENGTH_C = \frac{C}{C_L}, \tag{6}$$

for a total length of 0.721 inches. As discussed in more detail below, however, the striplines used to implement PCB embedded capacitive blocks 304-308 may be implemented in "parallel". In such an instance, diametrically opposing striplines, whose lengths are $LENGTH_C/2=0.361$ inches, may be extended from a particular node along the planar surface of the PCB layer to implement an equivalent capacitance.

Figure 3B:
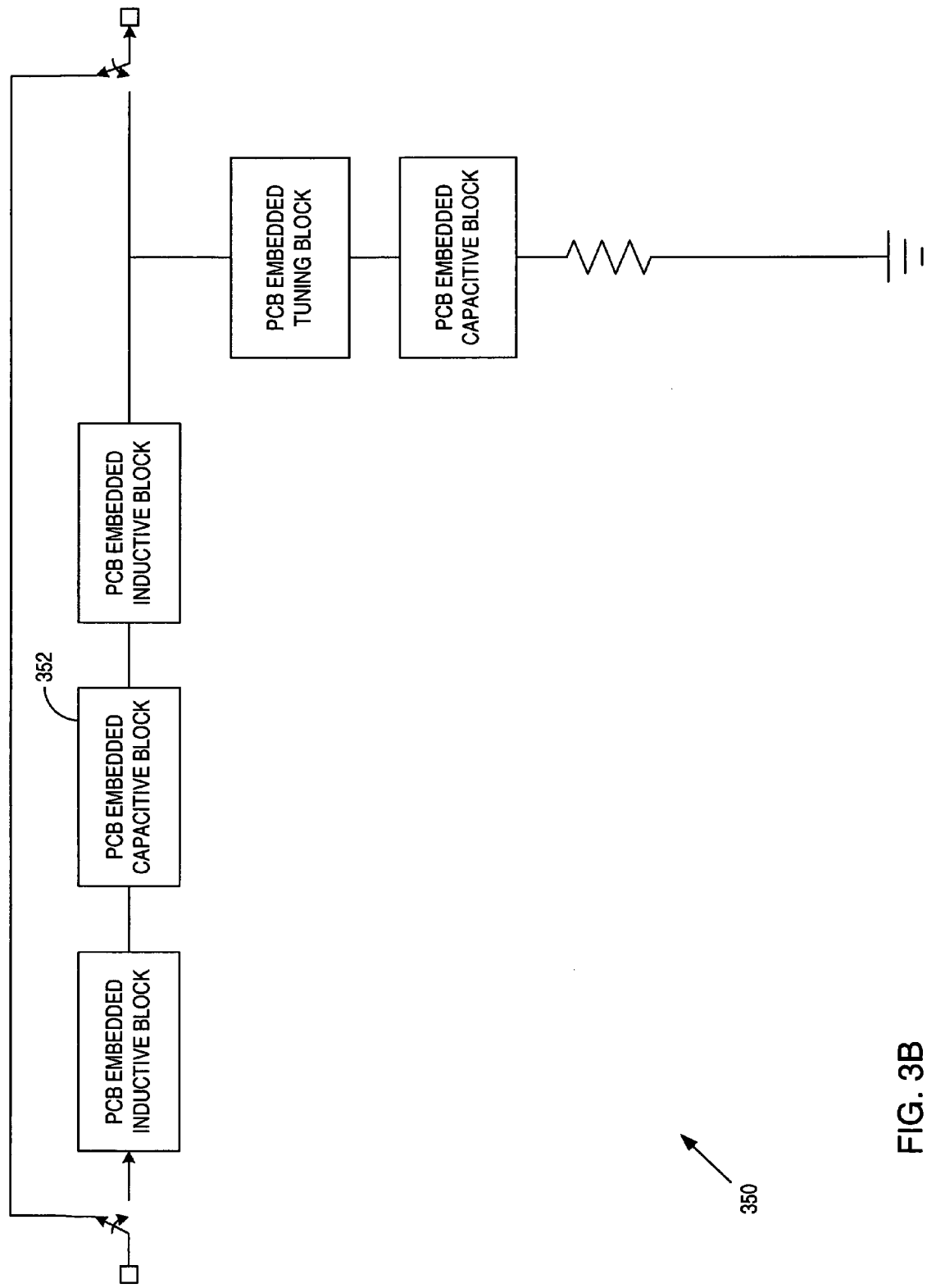
FIG. 3B illustrates an alternative block diagram of the PCB embedded filter of FIG. 2.

It is reasonable to replace capacitive blocks 304-308, which are shunt connected to inductive blocks 302 and 310, with series connected low-impedance transmission line 352, as illustrated in filter 350 of FIG. 3B, whose extra capacitance can be computed in a manner analogous to the inductance of equation 3. Since a series connected transmission line must apportion some capacitance to the 50 ohm system, the transmission lines used for series connections must be somewhat longer than transmission lines used in a shunt configuration. However, series connections can be beneficial at higher frequency applications where filters are smaller and do not utilize conductive vias to attach between inductive blocks 302 and 310. Thus, implementation of the series connected low-impedance transmission line may occur on the same layer, e.g., the top layer, as the inductive microstrips.

The L-C-L filter as implemented by PCB embedded inductive blocks 302, 310 and PCB embedded capacitive blocks 304-308 exhibits very low loss. As discussed in more detail below with respect to FIG. 3A, therefore, absorbing block 312 is added to introduce additional loss, which produces enhanced reflection characteristics at terminal 330. In addition, since terminal 326 is a virtual ground connection when filter 300 is being used in a differential mode, DC blocking is implemented by PCB embedded capacitive block 316 to prohibit upsetting the DC voltage component that exists at terminal 326.

To aid in the design of embedded inductive blocks 302, 310 and capacitive blocks 304-308, scattering parameters, or S-parameters, may be utilized to completely characterize operation of filter 300 at input port 328 and output port 330. S-parameters represent a parameter set that relates the traveling electromagnetic waves that are transmitted or reflected when an n-port network, such as filter 300, is inserted into a transmission line, such as path 236 or 238 of FIG. 2.

In particular, a set of four parameters may be used to determine the input reflection coefficient, $s_{11}$, the output reflection coefficient, $s_{22}$, the forward transmission gain, $s_{21}$, and the reverse transmission gain, $s_{12}$, of filter 300, respectively. Of particular interest, is the measure of forward transmission gain, $s_{21}$, as exemplified by trace 404 of FIG. 4, and the measure of output reflection coefficient, $s_{22}$, as exemplified by trace 402 of FIG. 4.

Figure 4:
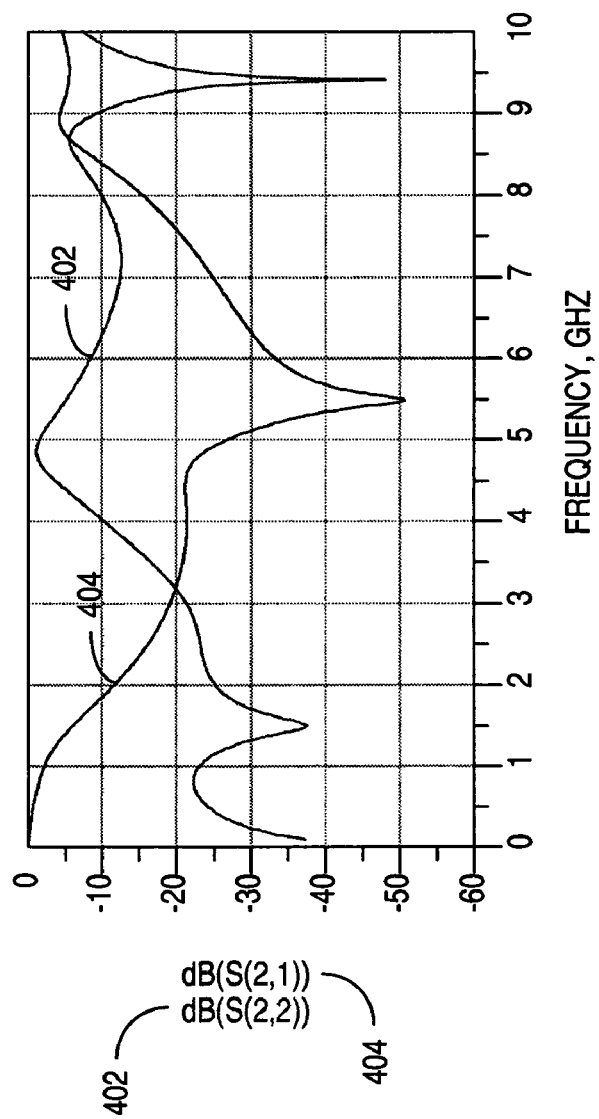
FIG. 4 illustrates an exemplary S-parameter plot of the PCB embedded filter of FIG. 3A.

Turning to trace 404 of FIG. 4, the forward transmission gain, $s_{21}$, of filter 300 is illustrated. As can be seen, the gain of filter 300 at DC is 0 decibels (dB), −3 dB at approximately 1.25 GHz and decreases to approximately −21 dB at 4 GHz. As such, the response of filter 300 is characterized as a low-pass frequency response, such that lower frequency content is passed with less attenuation between terminals 328 and 330, and higher frequency content is passed with more attenuation between terminals 328 and 330.

When backward-traveling energy, such as reflection 242, or other forms of interference, such as crosstalk 212, is incident on terminal 330 of filter 300, then portions of these signals may be reflected back toward the respective receiver, e.g., receiver 230 of FIG. 2. The ratio of the reflected voltage magnitude to the incident voltage magnitude is defined as the return loss and may be expressed in decibels (dB) as in equation (7):

$$\text{Return Loss} = 20 * \log(V_{reflected}/V_{incident}). \quad (7)$$

Thus, given a return loss of −20 dB, 1/10 of the incident voltage is reflected back to receiver 230. Similarly, a return loss of −40 dB results in 1/100 of the incident voltage being reflected back to receiver 230.

It can be seen by inspection of trace 402 of FIG. 4, that the return loss exhibited by filter 300 is less than −20 dB for all frequencies below about 3.2 GHz. As such, reflected signal voltage is reduced, or attenuated, by at least 90% by operation of filter 300. It should be noted that above 3.2 GHz, the return loss reduces to approximately −2 dB at 4.8 GHz. However, since the signal propagated by filter 300 is already being attenuated by approximately 25 dB at 4.8 GHz (by operation of $s_{21}$), then the amount of power being reflected is insignificant.

Absorbing block 312 serves the purpose of realizing enhanced return loss. Without the absorbing block, the return loss and insertion loss would have crossing points at −3 dB, which is an undesirable characteristic. Driven with a 50 ohm source, the L-C-L filter, as implemented by PCB embedded inductive blocks 302, 310 and PCB embedded capacitive blocks 304-308, presents a 50 ohm resistive impedance at low frequency which transitions to a moderate resistance with an inductive reactance at higher frequencies. The absorbing block 312 presents a high resistive impedance at low frequency which transitions to moderate impedance and capacitive reactance at higher frequencies. By tuning and adjusting parameters of PCB embedded tuning block 314 in FIG. 3A, it is demonstrated that inductive and capacitive components cancel and the resistive components combine to yield values very close to 50 ohms, which is required to absorb backward-traveling energy resulting in a low return loss.

As discussed in more detail below, inductive blocks 302 and 310 may be implemented using microstrips, and capacitive blocks 304-308 may be implemented with striplines. By adjusting the location where capacitive blocks 304-308 connect to inductive blocks 302 and 310, a smaller inductance may be appropriated to inductive block 302 by decreasing the length of its corresponding microstrip, while an increased inductance may be appropriated to inductive block 310 by increasing the length of the corresponding microstrip.

A balanced L-C-L filter is one in which capacitive blocks 304-308 are centered between inductive blocks 302 and 310, thus yielding equivalent length microstrips that correspond to inductive blocks 302 and 310. In one extreme case, however, capacitive blocks 304-308 may attach directly to port 328, which effectively transitions the balanced L-C-L filter to a C-L filter, whereby inductive block 302 is completely incorporated into inductive block 310. In response, the C-L filter exhibits a more gradual roll-off and lower bandwidth as compared to a balanced L-C-L filter.

Thus, by varying the location of capacitive blocks 304-308, tuning and optimization of the return loss, as well as other beneficial characteristics of filter 300, may be realized. A co-optimization of the impedance and length of tuning block 314, the capacitance of block 316 and the resistance of block 318 may also be undertaken. In some cases it may also be advantageous to optimize impedance values of capacitive blocks 304-308, but maintaining uniform impedance of these blocks is often sufficient.

Figure 5:
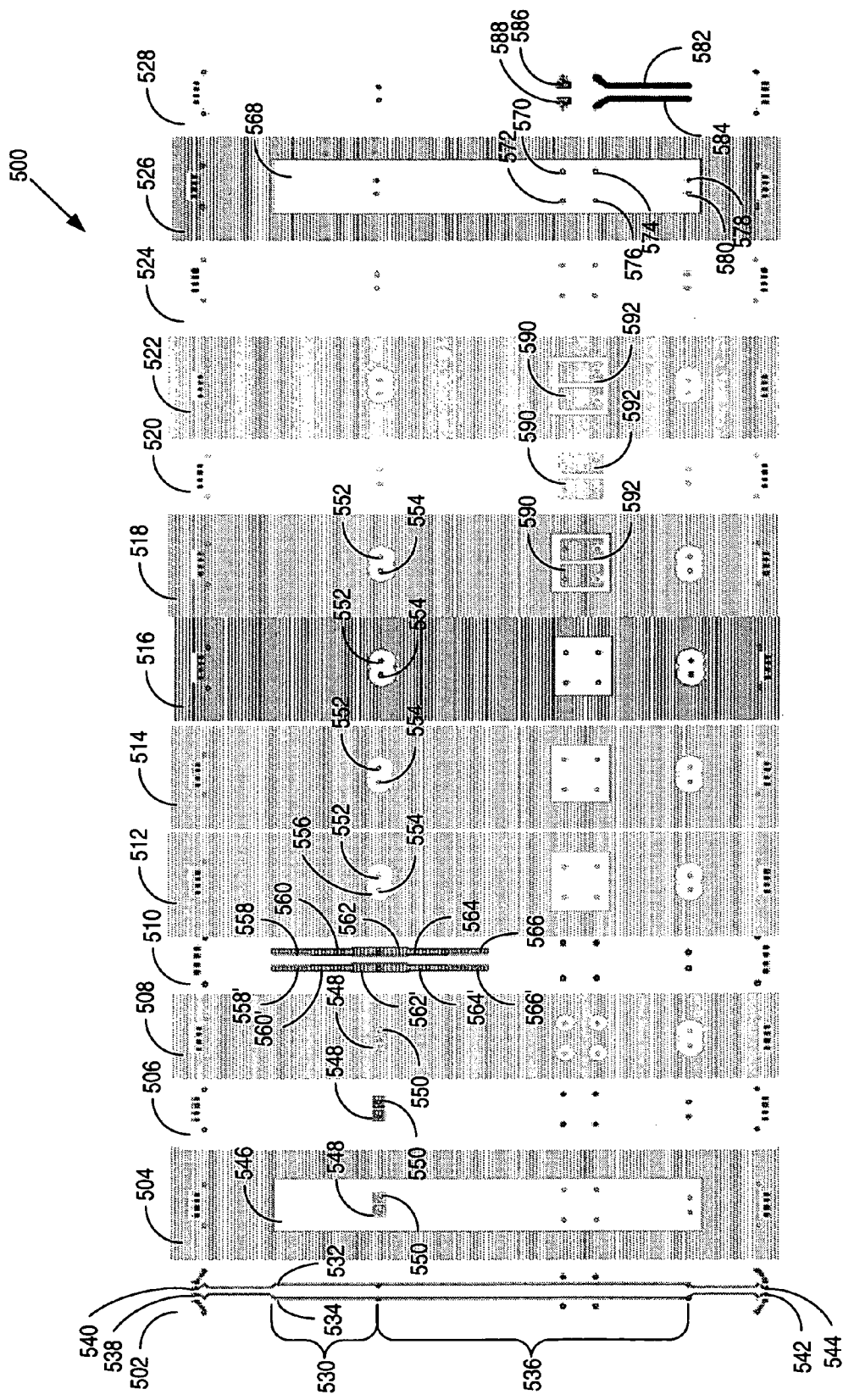
FIG. 5 illustrates an exemplary layout of the PCB embedded filter of FIG. 3A.

Turning to FIG. 5, PCB embedded filter 500 is exemplified as one embodiment of the implementation of filter 300 of FIG. 3A. In the embodiment of FIG. 5, a 14-layer PCB is exemplified, whereby layers 502, 504, 506, 508, 510, 512, 514, 516, 518, 520, 522, 524, 526, 528 (hereinafter 502-528) are arranged side-by-side for ease of discussion. In actuality, however, layers 502-528 are vertically disposed, one on top of another, and electrically isolated by a dielectric. The thickness of the dielectric is not necessarily held constant and may exhibit variation from layer to layer. Thus, layers 504-526 may be considered to be buried within the PCB, since they are not exposed to any surface area of the PCB.

In addition, layer 502 is exemplified as the top layer of the PCB and layer 528 is exemplified as the bottom layer of the PCB. The shaded portions of layers 504, 508, 512-518, 522, and 526 may represent ground plane. Conversely, the shaded portions may represent signal routing that is not associated with filter 300, provided that the shaded portions are not needed as a ground plane impedance reference for filter striplines and microstrips. It can be seen, therefore, that layers 502, 506, 510, 520, 524, and 528 are essentially void of ground plane and/or signal routing.

In one embodiment, the PCB area consumed by each layer of filter 300 is approximately equal to 1.2" by 0.1" for data rates approximately equal to 1.25 Gbps. In other embodiments, the PCB area required by each layer of filter 300 decreases as the data rate increases. The area required by filter 300, therefore, scales indirectly with the frequency of operation of filter 300 in a substantially linear fashion.

On layer 502, test pad 538 provides access to the primary input of filter 300 at terminal 328. In addition, test pad 540 provides access to the complementary input of filter 300 of a differential signal path. Similarly, test pad 542 provides access to the primary output from filter 300 at terminal 330, and test pad 544 provides access to the complementary output (not shown in FIG. 3A). Thus, the signal trace on layer 502 between signal pads 538 and 542 may represent the signal path and the signal trace between signal pads 540 and 544 may represent the complementary signal path. The following discussion of FIG. 5 assumes that differential signaling is being utilized, such that both the signal path and the complementary signal path are being filtered by corresponding filters of FIG. 3A.

Portion 530 represents a length of signal trace for microstrips 534 and 532, which implements PCB embedded inductive block 302 of FIG. 3A. As discussed above, the length of portion 530 may be determined, as in equations (3) and (4), by relating the characteristic impedance of microstrips 534 and 532 to the inductance magnitude that is required to implement PCB embedded inductive block 302 of FIG. 1.

Portion 530 of microstrips 534 and 532 each terminate into conductive vias 554 and 552, respectively, which electrically connect each of layers 502-528 to the output of PCB embedded inductive block 302, the input of PCB embedded inductive block 310, and to shunt PCB embedded capacitive blocks 304-308. Also connected to conductive vias 554 and 552, is the second half of microstrips 534 and 532, whose lengths are defined by portion 536, which correspond to PCB embedded inductive block 310. The length of portion 536 may be similarly determined through the use of equations (3) and (4). Layer 508 forms the ground plane reference for microstrips 534 and 532.

It should be noted that portions 530 and 536 of microstrips 534 and 532 may, or may not, be identical in length. While length calculations performed using equations (3) and (4) may yield identical length values for portions 530 and 536, simulation of filter 300 may nevertheless require that the length of portion 530 and the length of portion 536 be adjusted, so that the desirable $s_{21}$ and $s_{22}$ parameters of FIG. 4 may be obtained. Positioning of conductive vias 552 and 554 may be used to vary the lengths of portions 530 and 536. For example, if conductive vias 552 and 554 are placed ¼ of the distance from the input of filter 300, then ¼ of the total inductance within microstrips 534/532 is allocated to portion 530, while ¾ of the total inductance is allocated to portion 536.

Layer 510 incorporates the PCB embedded capacitive blocks 304-308, which are electrically connected to PCB embedded inductive blocks 302 and 310 via conductive vias 554 and 552. Capacitive blocks 304-308 are constructed using varying width striplines, which extend outwardly from conductive vias 554 and 552 along the plane of layer 510 as shown. Further, capacitive blocks 304-308 are arranged symmetrically about conductive vias 554 and 552, so as to decrease the length of each stripline, while simultaneously creating the desired characteristic impedance for capacitive blocks 304-308. It should be noted that striplines 558, 560, 562, 564, 566 (hereinafter 558-566) and 558', 560', 562', 564', 566' (hereinafter 558'-566') derive their ground plane reference from layers 508 and 512.

Such an implementation of capacitive blocks 304-308 is said to be a "parallel" combination, since for example, both portions of stripline 562 about conductive via 552 add to form PCB embedded capacitive block 304, striplines 560 and 564 add in parallel to form PCB embedded capacitive block 306, and striplines 558 and 566 add in parallel to form PCB embedded capacitive block 308. The lengths of striplines 558-566 and 558'-566' may be determined from equations (5) and (6) as discussed above.

It should be noted, that in order to decrease the impedance associated with conductive vias 554 and 552 between layers 502 and 510, conductive pads 548 and 550 are constructed. Thus, conductive vias 554 and 552 actually behave as if they are low impedance extensions of stripline components 562' and 562, respectively. As such, it can be seen that the length of stripline components 562 and 562' are somewhat shorter than the stripline components that form PCB embedded capacitive blocks 306 and 308.

Absorption block 312 is added to filter 300 at layer 528, where as discussed above, conductive vias 580 and 578 electrically connect PCB embedded inductive block 310 to absorption circuit 312 and output terminal 330. Microstrips 584 and 582, extending between conductive vias 580/578 and 576/574, respectively, form PCB embedded tuning block 314.

PCB embedded capacitive block 316 is implemented using conductive plates 590 and 592 on layers 518-522. Conductive plates 590 and 592 extend between conductive vias 576/574 and 572/570 to create an equivalent series capacitance by connecting capacitive plates 590 and 592 in parallel. Absorption block 312 is completed by placement of, for example, an SMT resistor 318 across pads 588 and 586 of layer 528. It should be noted that ground connection 326, as discussed above, is a virtual ground connection. Thus, instead of using two resistors for the filters, a single resistor whose resistance value is twice that which would normally be used can be substituted.

Other aspects and embodiments of the present invention will be apparent to those skilled in the art from consideration of the specification and practice of the invention disclosed herein. For example, while a filter exhibiting a low pass frequency response is presented, other filters exhibiting bandpass, highpass, and bandstop frequency responses may be similarly implemented. It is intended that the specification and illustrated embodiments be considered as examples only, with a true scope and spirit of the invention being indicated by the following claims.

What is claimed is:

1. A filter, comprising:
    a printed circuit board (PCB) arranged as a plurality of stacked layers, the plurality of stacked layers including,
        a first layer having an input port and an output port and a microstrip coupled between the input port and the output port, the microstrip having a first portion extending from the input port to a first conductive via and a second portion extending from the first conductive via to a second conductive via;
        a second layer coupled to the first layer by the first conductive via, the second layer including a first stripline coupled to the first conductive via, the first stripline extending outwardly from the first conductive via along a plane of the second layer; and
        a third layer coupled to the first and second layers by the second conductive via, the third layer including an absorbing circuit coupled to the second conductive via.

2. The filter of claim 1, wherein the first portion of the microstrip provides a first characteristic impedance and a first inductance magnitude.

3. The filter of claim 2, wherein a length of the first portion of the microstrip is inversely proportional to the first characteristic impedance and directly proportional to the first inductance magnitude.

4. The filter of claim 1, wherein the second portion of the microstrip provides a second characteristic impedance and a second inductance magnitude.

5. The filter of claim 4, wherein a length of the second portion of the microstrip is inversely proportional to the second characteristic impedance and directly proportional to the second inductance magnitude.

6. The filter of claim 1, further comprising a fourth layer disposed between the first layer and the second layer, the fourth layer providing a ground plane reference for the first and second portions of the microstrip.

7. The filter of claim 1, wherein the second layer further includes a second stripline coupled to the first conductive via, the second stripline being diametrically opposed to the first stripline along the plane of the second layer.

8. The filter of claim 7, wherein the first stripline includes a first plurality of portions, each portion having a different width relative to widths of the other portions.

9. The filter of claim 8, wherein the second stripline includes a second plurality of portions, each second portion having a different width relative to widths of the other second portions.

10. The filter of claim 9, wherein a width of a portion of the first plurality of portions is equal to a width of a corresponding portion of the second plurality of portions.

11. The filter of claim 10, wherein a length of a portion of the first plurality of portions is equal to a length of a corresponding portion of the second plurality of portions.

12. The filter of claim 1, wherein the absorbing circuit comprises:
a tuning block coupled to the second conductive via;
a capacitive block coupled to the tuning block; and
a resistive element coupled to the capacitive block.

13. A transmission system, comprising:
a transmission block coupled to receive a signal and adapted to filter the signal prior to transmission, the transmission block including,
a filter disposed on a plurality of layers of a printed circuit board (PCB), the PCB layers including,
a first layer having an input port and an output port and a signal path coupled between the input port and the output port to conduct the signal, the signal path adapted to conduct the signal through a first portion of the signal path extending from the input port to a first conductive via and further adapted to conduct the signal through a second portion of the signal path extending from the first conductive via to a second conductive via;
a second layer coupled to the first layer by the first conductive via, the second layer including a first stripline coupled to the first conductive via, the first stripline extending outwardly from the first conductive via along a plane of the second layer; and
a third layer coupled to the first and second layers by the second conductive via, the third layer including an absorbing circuit coupled to the second conductive via.

14. The transmission system of claim 13, wherein the first portion of the signal path includes a first microstrip having a first characteristic impedance and a first inductance magnitude, wherein a length of the first microstrip is inversely proportional to the first characteristic impedance and directly proportional to the first inductance magnitude.

15. The transmission system of claim 13, wherein the second portion of the signal path includes a second microstrip having a second characteristic impedance and a second inductance magnitude, wherein a length of the second microstrip is inversely proportional to the second characteristic impedance and directly proportional to the second inductance magnitude.

16. The transmission system of claim 13, wherein the second layer further includes a second stripline coupled to the first conductive via, the second stripline diametrically opposed to the first stripline, wherein capacitance values associated with the first and second striplines add to define a shunt capacitance of the filter.

17. The transmission system of claim 13, wherein the absorbing circuit comprises:
a tuning block coupled to the second conductive via;
a capacitive block coupled to the tuning block; and
a lumped resistive element coupled to the capacitive block.

18. A filter, comprising:
a first inductive block coupled to an input terminal of the filter, the first inductive block being configured without lumped elements on a first layer of a printed circuit board (PCB);
a first capacitive block coupled to an output of the first inductive block, the first capacitive block being configured without lumped elements;
a second inductive block coupled to the output of the first inductive block and the first capacitive block and coupled to an output terminal of the filter, the second inductive block being configured without lumped elements on the first layer of the PCB; and
an absorbing block coupled to the output terminal, the absorbing block including,
a tuning block coupled to the output terminal;
a second capacitive block coupled to the tuning block, the second capacitive block being configured on third, fourth, and fifth layers of the PCB; and
a resistive element coupled to the second capacitive block.

19. The filter of claim 18, wherein the first and second inductive blocks includes a microstrip having an inductance magnitude that is distributed between the first and second inductive blocks.

20. The filter of claim 18, wherein the first capacitive block comprises a single microstrip extending between the first and second inductive blocks on the first layer.

* * * * *